(12) United States Patent
Akaki

(10) Patent No.: US 7,598,521 B2
(45) Date of Patent: Oct. 6, 2009

(54) SEMICONDUCTOR DEVICE IN WHICH THE EMITTER RESISTANCE IS REDUCED

(75) Inventor: Osamu Akaki, Ota (JP)

(73) Assignee: Sanyo Electric Co., Ltd., Osaka (JP)

( * ) Notice: Subject to any disclaimer, the term of this patent is extended or adjusted under 35 U.S.C. 154(b) by 805 days.

(21) Appl. No.: 11/065,344

(22) Filed: Feb. 25, 2005

(65) Prior Publication Data

US 2005/0212088 A1 Sep. 29, 2005

(30) Foreign Application Priority Data

| Mar. 29, 2004 | (JP) | ............................. 2004-094686 |
| Mar. 29, 2004 | (JP) | ............................. 2004-094688 |

(51) Int. Cl.
  *H01L 29/40* (2006.01)
(52) U.S. Cl. .................. 257/47; 257/511; 257/587; 257/E29.03
(58) Field of Classification Search ............... 257/557, 257/560, 47, 197, 565, 587, 511, 525, E29.03, 257/E29.034, E29.044, E29.114
See application file for complete search history.

(56) References Cited

U.S. PATENT DOCUMENTS

| 4,005,470 | A | * | 1/1977 | Tucci et al. ................ 257/575 |
| 4,153,487 | A | * | 5/1979 | Tokumaru et al. ........... 438/325 |
| 4,286,177 | A | * | 8/1981 | Hart et al. ................... 326/100 |
| 5,032,887 | A | * | 7/1991 | Oliveri et al. ............... 257/560 |
| 5,107,320 | A | * | 4/1992 | Iranmanesh ................ 257/648 |
| 5,408,124 | A | * | 4/1995 | Palara ........................ 257/580 |
| 6,069,372 | A | * | 5/2000 | Uenishi ....................... 257/139 |
| 6,278,143 | B1 | * | 8/2001 | Ejiri ........................... 257/273 |

(Continued)

FOREIGN PATENT DOCUMENTS

JP 11-283990 10/1999

(Continued)

OTHER PUBLICATIONS

Japan Publication No. 2000-040703 "Electrode Structure of Transistor", Okada Tetsuya, Aug. 2, 2000 (English Translation).*

(Continued)

*Primary Examiner*—Khiem D Nguyen
(74) *Attorney, Agent, or Firm*—Morrison & Foerster LLP

(57) ABSTRACT

A semiconductor device includes a semiconductor chip having a collector region, a base region, and an emitter region that are formed in a semiconductor substrate. The semiconductor chip also includes a base electrode strip in contact with the base region, an emitter electrode strip in contact with the emitter region, an emitter electrode plate disposed above the base electrode strip and the emitter electrode strip, and a base electrode plate disposed adjacent the emitter electrode plate. The device also includes a base terminal external to the semiconductor chip and connected to the base electrode plate and an emitter terminal external to the semiconductor chip and connected to the emitter electrode plate. The base terminal and the emitter terminal are disposed along an edge of the semiconductor chip, and the base electrode strip and the emitter electrode strip are perpendicular to the edge of the semiconductor chip. The base electrode plate may have a protruding portion that engages with a dent formed in the emitter electrode plate.

12 Claims, 8 Drawing Sheets

U.S. PATENT DOCUMENTS 6,891,250 B1 * 5/2005 Sakamoto .................. 257/592
6,953,981 B1 * 10/2005 Johansson et al. ........... 257/503
2005/0212088 A1 * 9/2005 Akaki ....................... 257/587

FOREIGN PATENT DOCUMENTS

| JP | 2000-040703 | 2/2000 |
| JP | 2001-267564 | 9/2001 |
| JP | 2003-69015 | 3/2003 |
| JP | 2003-100766 | 4/2003 |

OTHER PUBLICATIONS

English Translation of the Japanese Publication No. 2000-040703.*

* cited by examiner

Prior Art

Prior Art

SEMICONDUCTOR DEVICE IN WHICH THE EMITTER RESISTANCE IS REDUCED

BACKGROUND OF THE INVENTION

1. Field of the Invention

The present invention relates to a semiconductor device. In particular, the present invention relates to a semiconductor device in which the emitter resistance is reduced.

2. Description of the Related Art

With reference to FIGS. 7A to 7C, a known semiconductor device will be described taking an npn-type transistor as an example.

FIG. 7A is a schematic diagram of the whole of a semiconductor element 100. FIG. 7B is a plan view of an electrode structure in a first layer, and dashed lines indicate electrodes in a second layer. FIG. 7C is a cross-sectional view taken along the E-E line of FIG. 7B.

A collector region 52 is provided on an n+ type silicon semiconductor substrate 51 by, for example, growing an n-type epitaxial layer or the like. In the surface of the collector region 52, a base region 53, which is a p-type impurity region, is provided. In the surface of the base region 53, an emitter region 54 is formed by diffusing n+-type impurities in the form of a grid. Thus, the base region 53 is separated into island-shaped patterns, and the island-shaped patterns and the emitter region 54 are arranged alternately. Incidentally, the separation into the island-shaped pattern is in apparent structure, and the base region 53 formed deeper than the emitter region 54 is a continuous region in a deeper region.

Hereinafter, the transistors formed of the base region 53 divided into the island-shaped patterns as described above and the emitter region 54 around the island-shaped patterns are referred to as cells, and the region in which a large number of cells are arranged is referred to as an operating region 58.

A base electrode and an emitter electrode which are connected to the base regions 53 and the emitter region 54 have two-layer structures, respectively.

First base electrodes 56 partially constituting the first layer are provided to form an island-shaped pattern and a strip pattern, and are in contact with the base regions 53 through first base contact holes BC1 provided in a first insulating film 25. A first emitter electrode 57 is provided in the form of a grid, and is in contact with the emitter region 54 through a first emitter contact hole EC1 provided in the first insulating film 25.

A second base electrode 66 and a second emitter electrode 67 constituting a second layer are provided above the first base electrodes 56 and the first emitter electrode 57 and connected thereto through second base contact holes (not shown) and second emitter contact holes EC2 (not shown) which are provided in a second insulating film 26.

The second base electrode 66 is provided over all the island-shaped first base electrodes 56 and parts of the strip-shaped first base electrodes 56, and is in contact therewith. The second emitter electrode 67 is provided over the strip-shaped first base electrodes 56 and is in contact with the first emitter electrode 57.

The second base electrode 66 and the second emitter electrode 67 are formed into the shapes of flat plates which cover the electrodes in the first layer as described above, and wire bonding is performed on these electrodes in the second layer, thus making it possible to expand a region in which wire bonding can be performed and to improve versatility in assembly. Further, since the second base electrode 66 and the second emitter electrode 67 are adjacent to each other only at respective one of the edges of the rectangles thereof, it is only necessary to take these parts into consideration in terms of difference in mask alignment and a clearance for obtaining a desired resist pattern. This technology is described for instance in Japanese Patent Application Publication No. 2000-40703.

FIG. 8 shows a case of mounting the aforementioned semiconductor chip 100.

There are cases where both of a base terminal B and emitter terminals E are arranged along one edge of the chip (lower edge of the chip in the drawing), for example, as shown in FIG. 8, in an assembly process. In those cases, since external terminals (e.g. leads) 200 arranged along one edge of the chip are connected to the second emitter electrode 67 and the second base electrode 66, these can be connected using bonding wires 150 as shown in the drawing in the case of an electrode structure in which the electrodes in the second layer have the shapes of flat plates.

Here, a reduction in emitter resistance is desirable for the improvement in characteristics of a bipolar transistor. Accordingly, efforts including, for example, securing a large area of the second emitter electrode 67 and making bonding wires as short as possible, are made.

Moreover, in particular, with the trend toward thinner packages, there are demands for a lower loop of a bonding wire. Accordingly, in some cases, the wire bond positions are set to the vicinity of an edge portion of the chip as shown in the drawing so that the low loops do not come into contact with the chip edge portion.

However, depending on the positions of the contact holes for connecting the electrodes in the first layer and in the second layer, parts to be current paths include a two-layer part formed of the first emitter electrode 57 and the second emitter electrode 67 and a one-layer part formed only of the second emitter electrode 67. In the case where the wire bond positions are in a chip edge portion, the emitter resistance from, for example, the part of the first emitter electrode 57 on the upper edge side in the drawing, to the wire bond position, becomes high. Accordingly, there has been the problem of a reduction in emitter resistance or the thinning of a chip being not developed.

SUMMARY OF THE INVENTION

The invention provides a semiconductor device that includes a semiconductor substrate of a first general conductivity type, which is configured to operate as a collector region, a base region of a second general conductivity type, which is disposed on the semiconductor substrate, an emitter region of the first general conductivity type, which is formed in a form of a grid in a surface of the base region so that the grid defines islands of the base region surrounded by the emitter region, a base electrode strip connecting the islands of the base regions, an emitter electrode strip disposed on the grid of the emitter region along the base electrode strip, an emitter electrode plate disposed above the base electrode strip and the emitter electrode strip, which is connected to the emitter electrode strip and not connected to the base electrode strip, and a base electrode plate disposed over the semiconductor substrate and adjacent the emitter electrode plate, which covers the grid of the emitter region and other islands of the base region defined by the grid that are not covered by the emitter electrode plate. The base electrode strip is connected to the base electrode plate.

The invention also provides a semiconductor device that includes a semiconductor chip having a collector region, a base region, and an emitter region that are formed in a semiconductor substrate. The semiconductor chip also includes a base electrode strip in contact with the base region, an emitter electrode strip in contact with the emitter region, an emitter electrode plate disposed above the base electrode strip and the emitter electrode strip, and a base electrode plate disposed adjacent the emitter electrode plate. The device also includes a base terminal external to the semiconductor chip and connected to the base electrode plate and an emitter terminal external to the semiconductor chip and connected to the emitter electrode plate. The base terminal and the emitter terminal are disposed along an edge of the semiconductor chip, and the base electrode strip and the emitter electrode strip are perpendicular to the edge of the semiconductor chip.

DETAILED DESCRIPTION OF THE INVENTION

With reference to FIGS. 1A to 6, an embodiment of the present invention will be described in detail taking an npn-type bipolar transistor as an example.

Figure 1A:
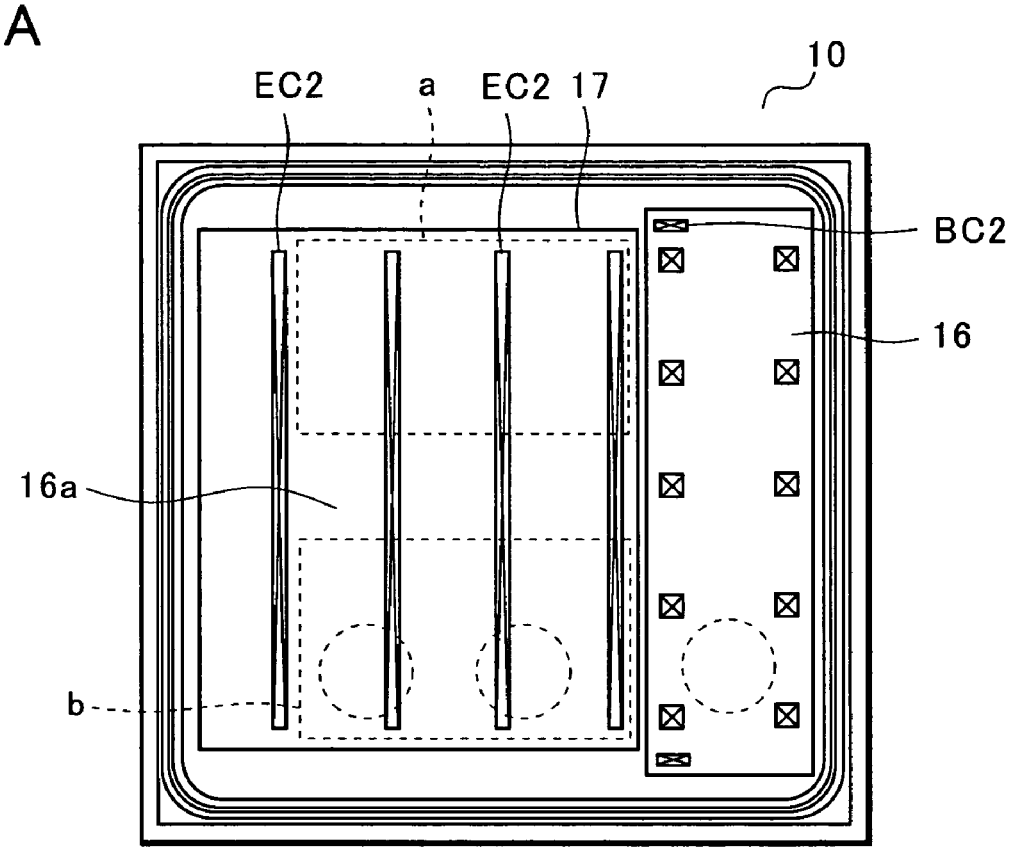
FIGS. 1A and 1B are plan views for explaining the present invention.
Figure 1B:
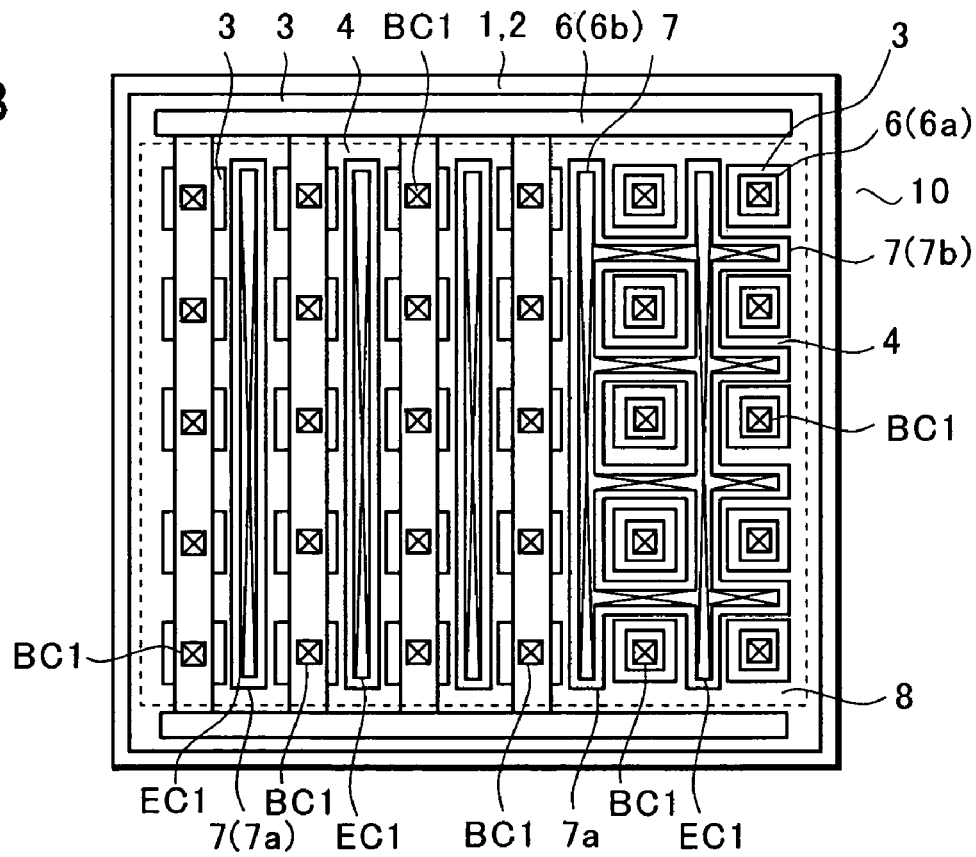

FIGS. 1A and 1B show the structure of a semiconductor device 10, which is a first embodiment of the present invention. FIG. 1A is a plan view showing an electrode structure in a second layer, and FIG. 1B is a plan view showing an electrode structure in a first layer and diffusion regions.

The npn-type bipolar transistor 10 of the present embodiment includes a collector region 2, a base region 3, an emitter region 4, first base electrodes 6, first emitter electrodes 7, a second base electrode 16, and a second emitter electrode 17.

A semiconductor substrate 1 is a high concentration n+ type impurity semiconductor substrate, on which the collector region 2 is provided by, for example, growing an n-type epitaxial layer.

The base region 3 is a p-type diffusion region provided on the surface of the collector region 2. In the surface of the base region 3, the emitter region 4 is formed by diffusing n+ type impurities in the form of a grid. Thus, the base region 3 is separated into island-shaped patterns shown as squares in the drawing. Incidentally, the separation into the island-shaped patterns is in apparent structure. The base region 3 formed deeper than the emitter region 4 is a continuous region in a deeper region. A large number of cells formed of the base region 3 separated into the island-shaped patterns and the grid-shaped emitter region 4 around the island-shaped patterns are arranged to constitute an operating region 8 indicated by a dashed line (refer to FIG. 1B).

A base electrode and an emitter electrode which are connected to base regions 3 and the emitter region 4 have two-layer structures, respectively. Further, though not shown, the collector region 2 is electrically connected to a collector electrode.

As shown in FIG. 1A, the second base electrode 16 and the second emitter electrode 17 constituting the second layer are provided above the first base electrodes 6 and the first emitter electrodes 7 with a second insulating film (not shown) interposed therebetween. The second base electrode 16 and the second emitter electrode 17 have the shapes of flat plates, respectively, and are arranged adjacent to each other. The width of the second base electrode 16 only needs to be set so that an area enough to fix one bonding wire thereto (a dashed-line circle) can be secured. The second emitter electrode 17 is provided in such a manner that the second emitter electrode 17 becomes larger than the second base electrode 16 and covers more than half of the operating region 8.

As shown in FIG. 1B, the first base electrodes 6 form two types of patterns. That is, there are first base electrodes 6a forming island-shaped patterns superimposed on the island-shaped base regions 3, and first base electrode 6b forming, for example, a ladder pattern in which vertical sticks each couple a plurality of island-shaped base regions 3 together and in which the sticks are connected to each other outside the operating region 8. The parts with which the sticks are connected to each other are extended to the region under the second base electrode 16.

The island-shaped first base electrodes 6a are placed under the second base electrode 16, and the ladder-shaped first base electrode 6b is placed under the second emitter electrode 17. Further, the first base electrodes 6 are in contact with the base regions 3 through first base contact holes BC1 provided in a first insulating film (not shown).

The first emitter electrodes 7 also form two types of patterns. That is, there are first emitter electrodes 7a forming a strip pattern placed in openings of the ladder-shaped first base electrode 6b, and first emitter electrode 7b forming a grid pattern placed among the island-shaped first base electrodes 6a. The grid-shaped first emitter electrode 7b is connected to part of the strip-shaped first emitter electrodes 7a. Further, the first emitter electrodes 7 are in contact with the emitter region 4 through first emitter contact holes EC1 provided in the first insulating film (not shown).

Moreover, the strip-shaped first emitter electrodes 7a and the stick parts of the ladder-shaped first base electrode 6b are arranged parallel to the adjacent edges of the second emitter electrode 17 and the second base electrode 16.

Figure 2A:
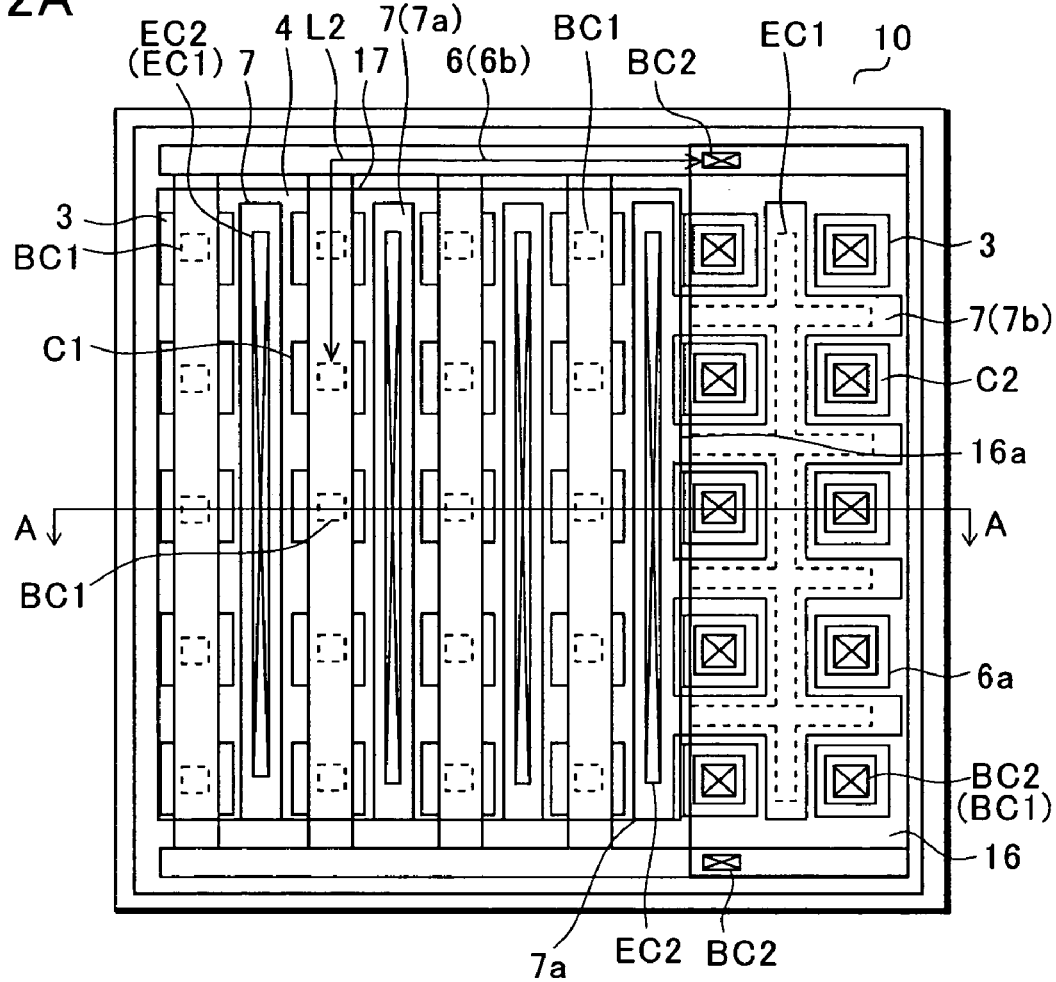
FIGS. 2A and 2B are a plan view and a cross-sectional view for explaining the present invention, respectively.
Figure 2B:
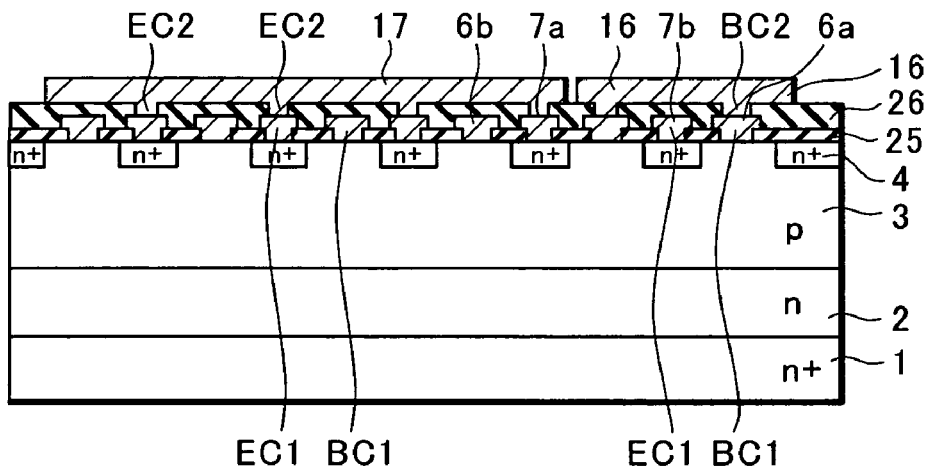

FIG. 2A is a plan view in which FIGS. 1A and 1B overlap each other. Further, FIG. 2B is a cross-sectional view taken along the A-A line of FIG. 2A.

Under the second emitter electrode 17, the emitter region 4 is connected to the strip-shaped first emitter electrodes 7a through the first emitter contact holes EC1 provided in the first insulating film 25, and is further connected to the second emitter electrode 17 through second emitter contact holes EC2 provided in the second insulating film 26. That is, under the second emitter electrode 17, the emitter region 4 is almost directly connected to the second emitter electrode 17 through the first and second emitter contact holes EC1 and EC2.

Moreover, the base regions 3 under the second emitter electrode 17 are in contact with the ladder-shaped first base electrode 6b through the first base contact holes BC1, are connected to each other outside the operating region 8 to be extended to the second base electrode 16 side, and are made into contact with the second base electrode 16 through second base contact holes BC2.

On the other hand, under the second base electrode 16, the emitter region 4 is in contact with the grid-shaped first emitter electrode 7b through the first emitter contact holes EC1.

Further, the grid-shaped first emitter electrode 7b is connected to the strip-shaped first emitter electrode 7a, thus being connected to the second emitter electrode 17 through the second emitter contact holes EC2.

Moreover, the base regions 3 under the second base electrode 16 are in contact with the island-shaped first base electrodes 6a through the first base contact holes BC1, and the island-shaped first base electrodes 6a are in contact with the second base electrode 16 through the second base contact holes BC2. That is, under the second base electrode 16, the base regions 3 are almost directly connected to the second base electrode 16 through the first and second base contact holes BC1 and BC2.

In the present embodiment, for the second base electrode 16, it is only necessary to secure an area enough for contact bonding of a bonding wire thereto, and the area occupied by the second emitter electrode 17 is made as large as possible, thus contributing to a reduction in emitter resistance.

Further, since the second base electrode 16 and the second emitter electrode 17 have the shapes of flat plates, there are few limitations on the position to which bonding wires are fixed, and versatility when mounting the chip is improved.

Furthermore, in the present embodiment, in the case where wire bonding is performed in the vicinity of a region where the stick parts of the ladder-shaped first base electrode 6b are connected to each other outside the operating region 8, the strip-shaped first emitter electrodes 7a almost linearly extend from the positions to which bonding wires are fixed. This can contribute to a reduction in emitter resistance. This will be described below.

Figure 3A:
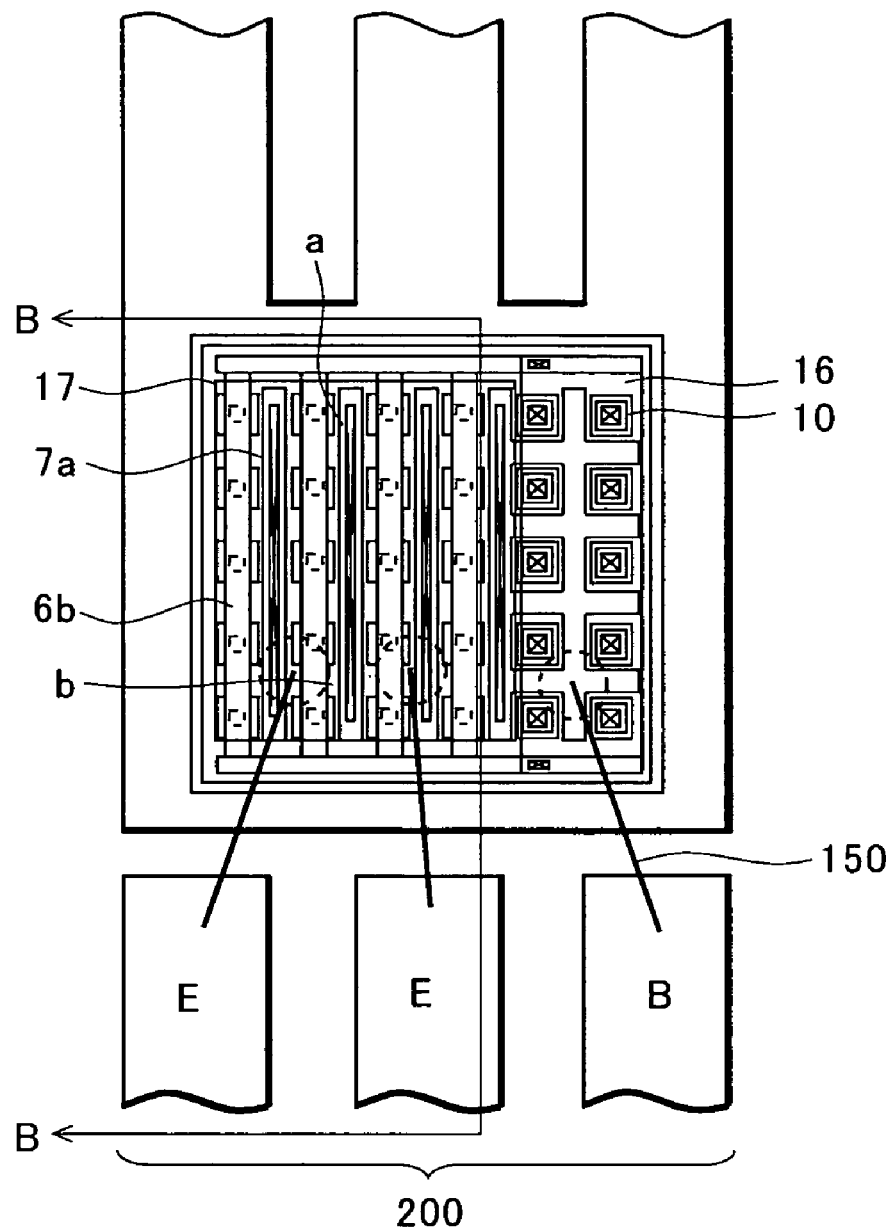
FIGS. 3A and 3B are a plan view and a cross-sectional view for explaining the present invention, respectively.
Figure 3B:
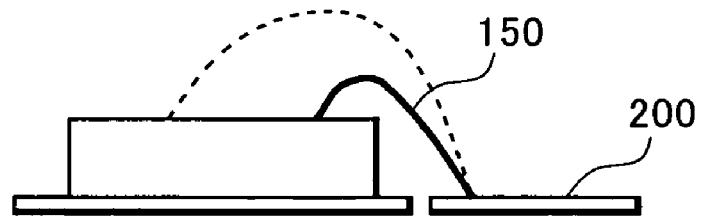

FIGS. 3A and 3B show the case of mounting the above-described semiconductor element 10 in a package. FIG. 3A is a plan view, and FIG. 3B is a cross-sectional view. These drawings show an example, in which leads are adopted as external terminals. Other than this, the embodiment of the present invention can similarly be applied to a chip size package or the like, for example, in which a conductive pattern is provided on an insulating substrate of ceramic or the like.

In the case where, as shown in FIG. 3A, mounting is performed in such a manner that a plurality of external terminals 200 are provided along one edge of the chip (lower chip edge in the drawing) and that both of a base terminal B and emitter terminals E are led out as the external terminals along the same edge side, the electrode structure of the present embodiment is advantageous.

In the first embodiment, the strip-shaped first emitter electrodes 7a and the stick parts of the ladder-shaped first base electrode 6b are arranged parallel to the adjacent edges of the second emitter electrode 17 and the second base electrode 16. That is, the second emitter electrode 17 and the second base electrode 16 can be each connected to the external terminals 200 by the wire bonding of bonding wires 150 to the positions indicated by dashed lines in a chip edge portion. Further, in the case where the bonding wires 150 are fixed as shown in the drawing, the strip-shaped first emitter electrodes 7a are arranged perpendicular to the edge of the chip 10 along which the external terminals 200 are arranged. That is, since the most part of the first emitter electrodes 7 linearly extends from directly under the bonding wires 150, the resistance from the first emitter electrodes 7 to the bonding wires 150 can be prevented from increasing.

Accordingly, the lengths of the bonding wires 150 can be set to required minimum lengths, and the bonding wires 150 can contribute to a reduction in emitter resistance in conjunction with the second emitter electrode 17 having a large area.

Furthermore, wire bonding can be performed in a chip edge portion as shown in FIG. 3B in an electrode structure in which the resistance of the first emitter electrodes 7 is prevented from increasing, and mounting in a thin-type package can therefore be performed. In wire bonding, loop height needs to be set so that the chip edge portion and the bonding wires 150 do not come into contact with each other. For this reason, specifically, in the case where wire bonding is performed in the vicinity of the chip center (indicated by a dashed line) in a chip having the same size as that in the present embodiment, the thickness of a package needs to be approximately 0.9 mm. However, in the present embodiment, since loops of wire bonds can be made lower by setting wire bond positions to the chip edge portion, the package thickness can be reduced to, for example, approximately 0.75 mm.

Next, with reference to FIGS. 4 to 6, a second embodiment of the present invention will be described.

In case of the first embodiment, under the second emitter electrode 17, the first base electrodes 6 which are arranged parallel to the first emitter electrodes 7, are connected to each other outside the operating region 8 to be connected to the second base electrode 16. That is, compared to the base region 3 of the cell C2 which is directly connected to the second base electrode 16 through the second base contact hole BC2 under the second base electrode 16, the distance L2 between the base region 3 and the second base electrode 16 is longer in, for example, the cell C1 (refer to FIG. 2A). Accordingly, the extraction of minority carriers in the base regions is slow when the transistor is turned off, and this may compromise high-speed operation.

Figure 4:
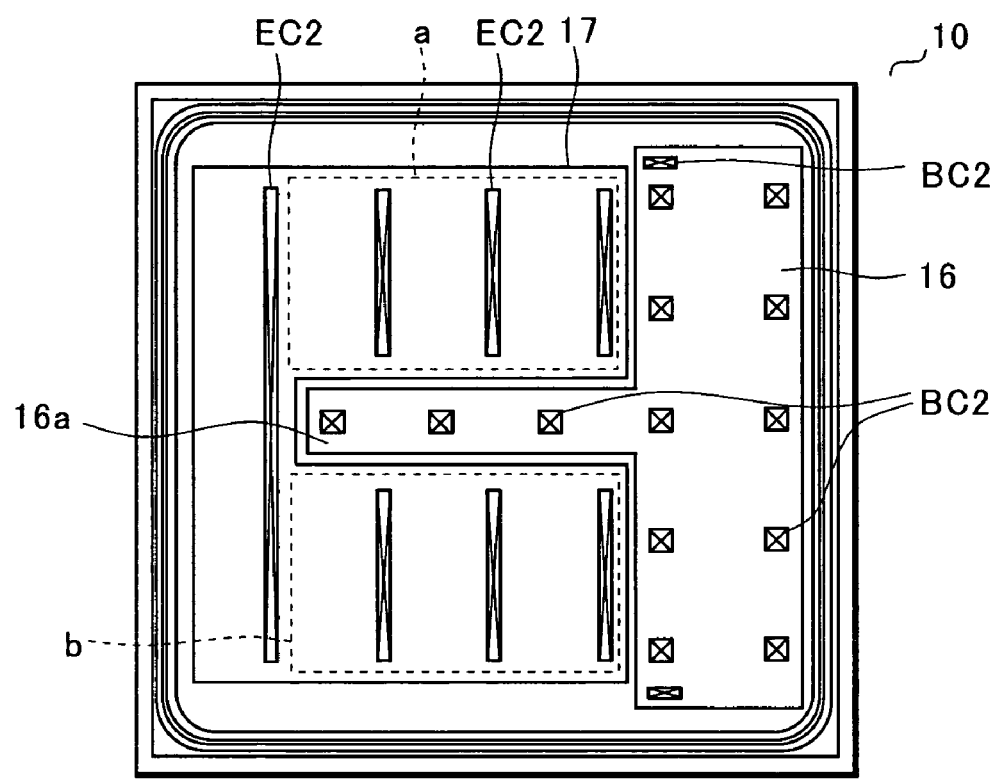
FIG. 4 is a plan view for explaining the present invention.

In the second embodiment, as shown in FIG. 4, the second base electrode 16 has the protruding portion 16a extending to almost equally separate part of the second emitter electrode 17. The second emitter electrode 17 has a shape surrounding the protruding portion 16a. The second emitter electrode 17 is not completely separated by the protruding portion 16a but has the shape of a continuous flat plate.

Further, the second emitter electrode 17 has, for example, separated regions which are above and below the protruding portion 16a, respectively, and which have almost equal areas. In this specification, for convenience of explanation, the upper region is referred to as a separated region a, and the lower region is referred to as a separated region b. Here, the number of protruding portions 16a is not limited to one and may be two or more. In this case, the protruding portions 16a are provided so that regions separated by the protruding portions 16a have almost equal areas. Further, in the present embodiment, a description will be made taking as an example the case where the protruding portion 16a is provided so as to cover one line of the base regions 3. However, other than this, the shape which continuously covers a plurality of lines may be adopted. Note, however, that the second emitter electrode 17 (separated regions a and b) separated by the protruding portion 16a has at least areas enough to fix bonding wires thereto.

Figure 5A:
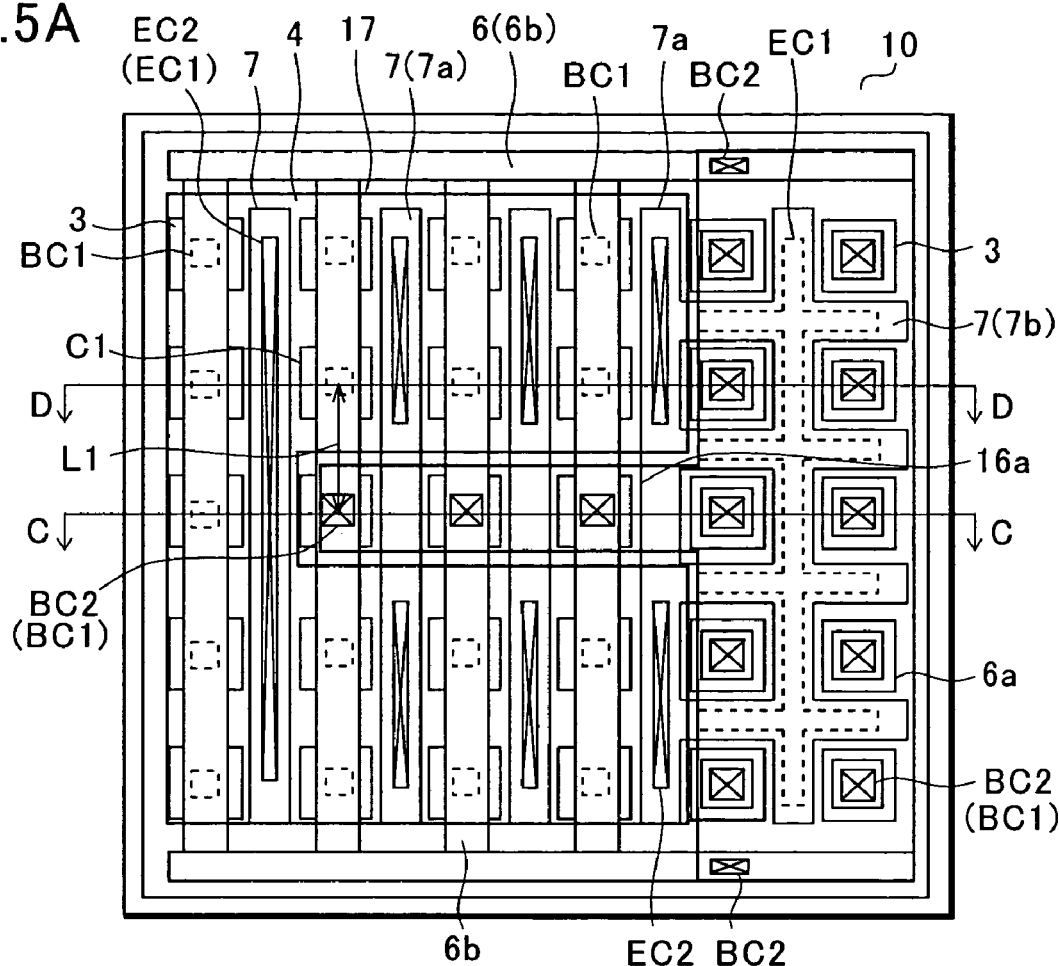
FIG. 5A is a plan view for explaining the present invention.
Figure 5B:
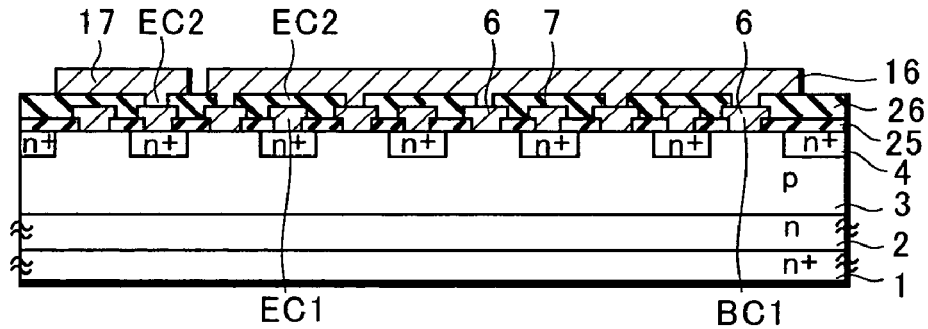
FIGS. 5B and 5C are cross-sectional views for explaining the same.
Figure 5C:
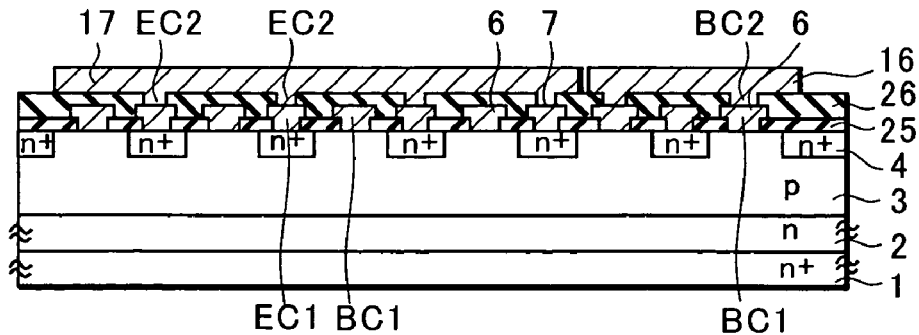

FIG. 5A is a plan view which piled up the electrodes in the first layer, and the electrodes in the second layer. The structure of the electrodes in the first layer is the same as that of FIG. 1B. Further, FIG. 5B is a cross-sectional view taken along the C-C line of FIG. 5A, and FIG. 5C is a cross-sectional view taken along the D-D line of FIG. 5A.

In the second embodiment, the protruding portion 16a extended from the second base electrode 16 is provided along the direction perpendicular to the ladder-shaped first base electrode 6b and the strip-shaped first emitter electrodes 7a. The protruding portion 16a is extended over the ladder-shaped first base electrode 6b in a range in which the second emitter electrode 17 is not completely divided. Further, second base contact holes BC2 are provided in the part of the second insulating film (not shown here) in which the protruding portion 16a and the ladder-shaped first base electrode 6b overlap each other, thus connecting the second base electrode 16 (protruding portion 16a) and the ladder-shaped first base electrode 6b. That is, in the protruding portion 16a, the base regions 3 are almost directly connected to the second base electrode 16 through the first and second base contact holes BC1 and BC2.

This makes it possible to place the base regions 3 of the cells, arranged in the separated regions a and b, closer to the second base electrode 16 (protruding portion 16a).

That is, when attention is focused on the same cell C1 as in the case of FIG. 2A, the distance L1 between the base region 3 of the cell C1 which is in contact therewith only through the first base contact hole BC1 and the second base electrode 16 (protruding portion 16a) can be reduced. Further, the ladder-shaped first base electrode 6b is equally divided by the protruding portion 16a, and differences among the distances from each of the base regions 3 to the second base electrode 16 are also reduced as a whole. Accordingly, carriers in the base regions can be extracted faster when the transistor is turned off, thus making high-speed operation possible.

As one example, in a comparison of distances from the cell C1 to the nearest second base contact BC2, the distance L1 in the present embodiment can be made shorter than the distance L2 in FIG. 2A by approximately 75%, and base carriers can be extracted faster. Accordingly, the present embodiment has advantages in high-speed switching.

Figure 6:
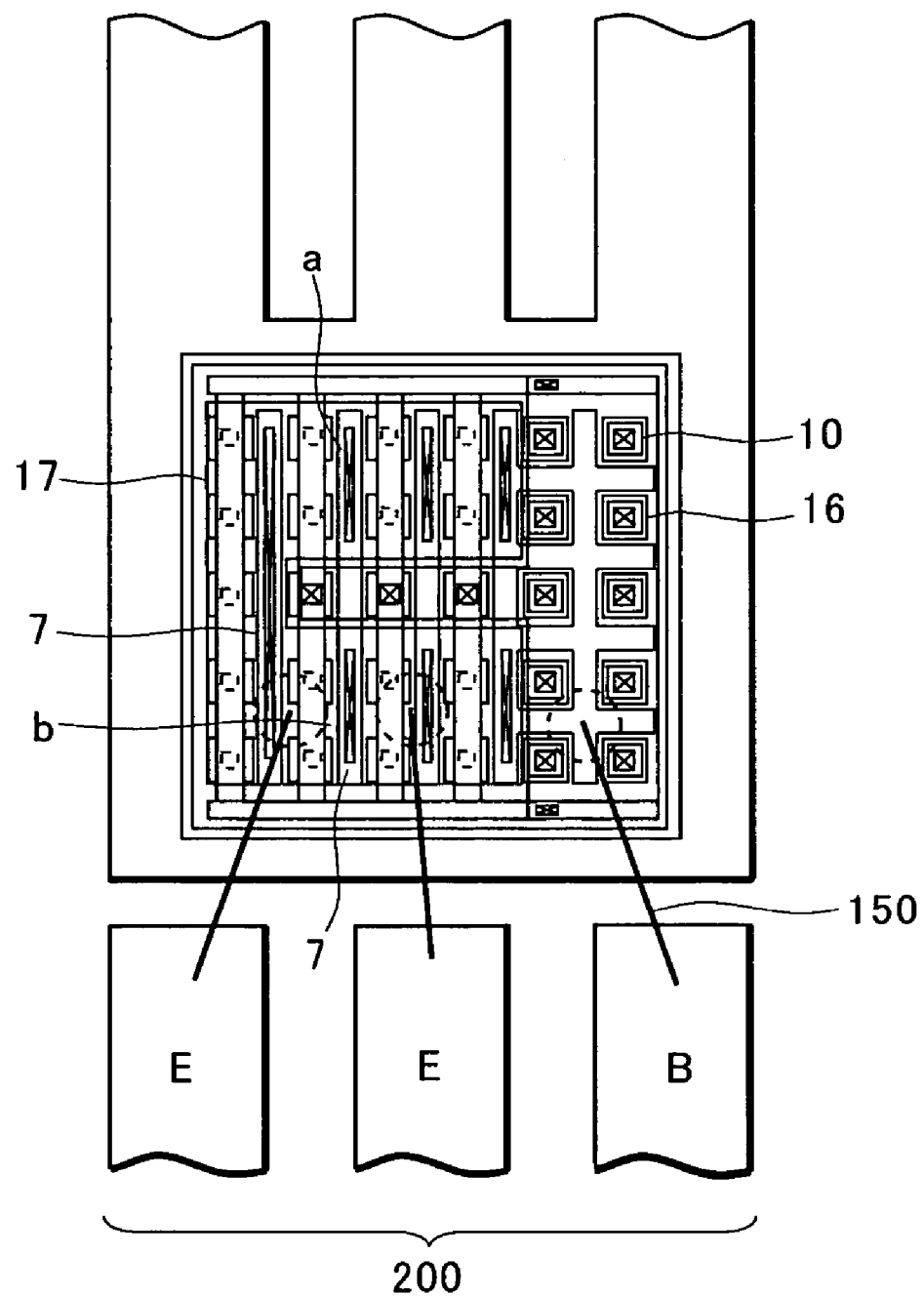
FIG. 6 is a plan view for explaining the present invention.
Figure 7A:
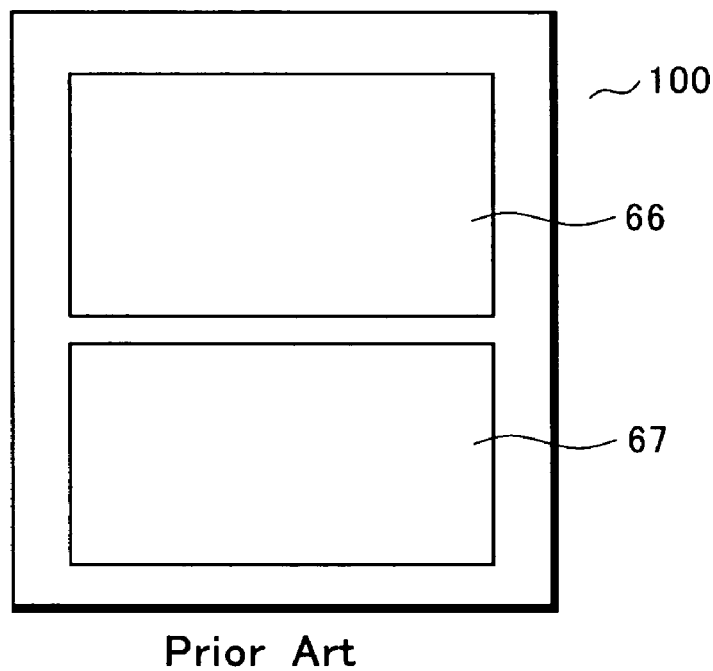
FIGS. 7A and 7B are plan views for explaining the conventional technology, and 7C is a cross-sectional view for explaining the same.
Figure 7B:
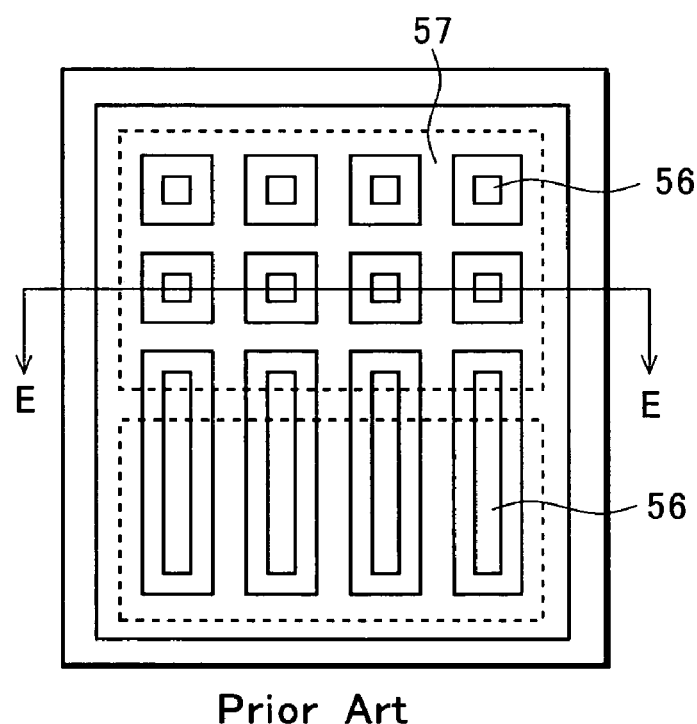
Figure 7C:
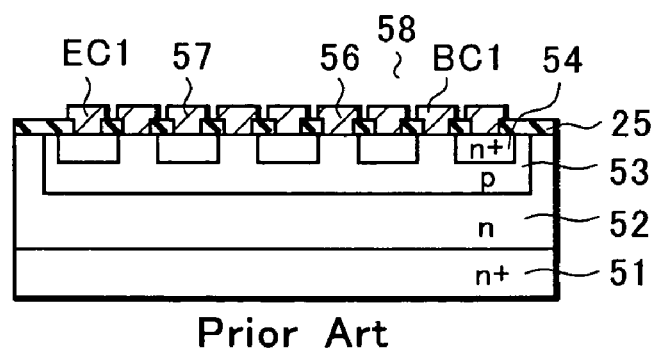
Figure 8:
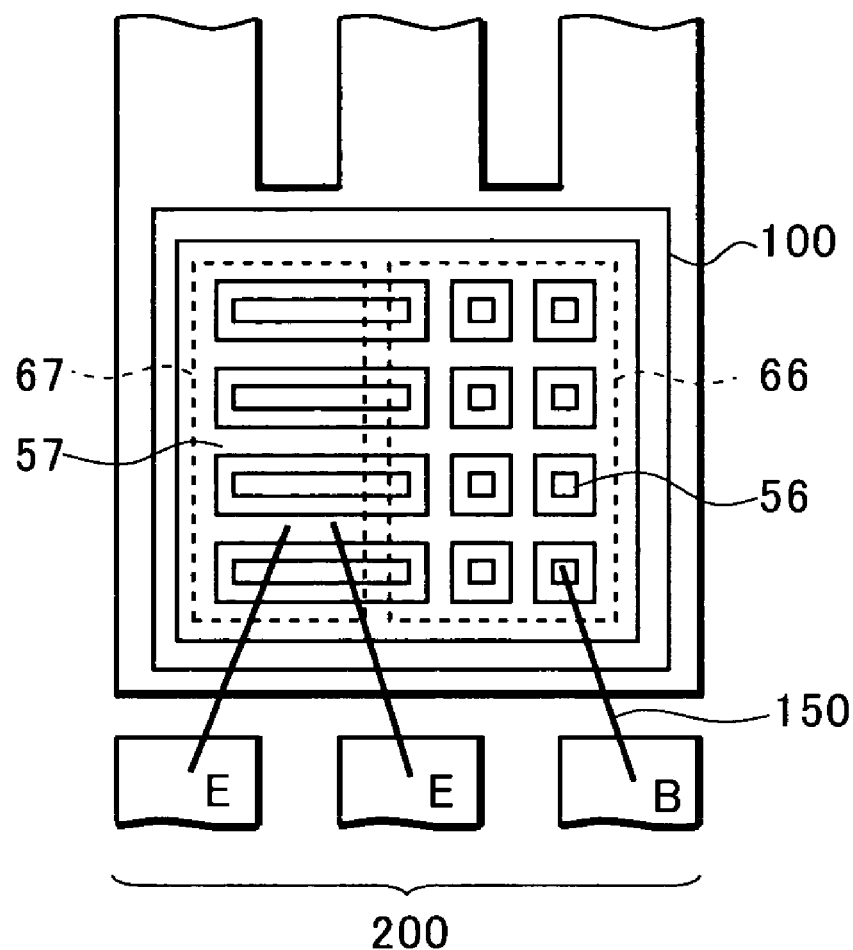
FIG. 8 is a plan view for explaining the conventional technology.

FIG. 6 shows the case of mounting the above-described semiconductor element 10 in a package. This drawing shows an example, in which leads are adopted as external terminals. Other than this, the embodiment of the present invention can similarly be applied to a chip size package or the like, for example, in which a conductive pattern is provided on an insulating substrate of ceramic or the like, similarly.

In the case where, as shown in the drawing, mounting is performed in such a manner that a plurality of external terminals 200 are provided along one edge of the chip (lower chip edge in the drawing) in, for example, the vicinity of the separated region b and in such a manner that both of a base terminal B and emitter terminals E are led out as the external terminals along the same edge side, the electrode structure of the present embodiment is advantageous.

That is, bonding wires 150 are wire bonded to the positions indicated by dashed-line circles in the separated region b, and the second emitter electrode 17 and the second base electrode 16 are each connected to the external terminals 200. In the present embodiment, in the case where the bonding wires 150 are fixed as shown in the drawing, the strip-shaped first emitter electrodes 7a are arranged perpendicular to the edge of the chip 10 along which the external terminals 200 are arranged. That is, since the most part of the first emitter electrodes 7 linearly extends from directly under the bonding wires 150, the resistance from the first emitter electrodes 7 to the bonding wires 150 can be prevented from increasing.

These advantages can also be obtained in the case where the external terminals 200 are arranged on the separated region a side and where wire bonding is performed on the separated region a side.

As described above, an npn-type bipolar transistor has been described in the present embodiment. However, the embodiment of the present invention can also be similarly carried out in a pnp type, and the same advantages can be obtained.

What is claimed is:

1. A semiconductor device comprising:
a semiconductor substrate of a first general conductivity type, the semiconductor substrate being configured to operate as a collector region;
a base region of a second general conductivity type, the base region being disposed on the semiconductor substrate;
an emitter region of the first general conductivity type, the emitter region being formed in a form of a grid in a surface of the base region so that the grid defines islands of the base region surrounded by the emitter region;
a base electrode strip connecting the islands of the base region;
an emitter electrode strip disposed on the grid of the emitter region along the base electrode strip;
an emitter electrode plate disposed above the base electrode strip and the emitter electrode strip, the emitter electrode plate being connected to the emitter electrode strip and not connected to the base electrode strip;
a base electrode plate disposed over the semiconductor substrate and adjacent the emitter electrode plate, the base electrode plate covering the grid of the emitter region and other islands of the base region defined by the grid that are not covered by the emitter electrode plate; and
an electrode wiring connecting the base electrode strip and the base electrode plate and disposed along an edge of the semiconductor substrate,
wherein the base electrode strip is connected to the base electrode plate.

2. The semiconductor device of claim 1, further comprising electrical connections connecting the semiconductor device and external terminals, wherein the electrical connections are formed on the emitter electrode plate and the base electrode plate along the edge of the semiconductor substrate.

3. A semiconductor device comprising:
a semiconductor chip comprising a collector region, a base region, and an emitter region that are formed in a semiconductor substrate, the semiconductor chip further comprising a base electrode strip in contact with the base region, an emitter electrode strip in contact with the emitter region, an emitter electrode plate disposed above the base electrode strip and the emitter electrode strip, and a base electrode plate disposed adjacent the emitter electrode plate;
a base terminal external to the semiconductor chip and connected to the base electrode plate; and
an emitter terminal external to the semiconductor chip and connected to the emitter electrode plate,
wherein the base terminal and the emitter terminal are disposed along an edge of the semiconductor chip, and the base electrode strip and the emitter electrode strip are perpendicular to the edge of the semiconductor chip.

4. The semiconductor device of claim 3, further comprising an electrode wiring connecting the base electrode strip and the base electrode plate and disposed along the edge of the semiconductor chip.

5. The semiconductor device of claim 3, wherein the base terminal is connected to the base electrode plate near the edge of the semiconductor chip and the emitter terminal is connected to the emitter electrode plate near the edge of the semiconductor chip.

6. The semiconductor device of claim 3, wherein the emitter electrode strip is parallel to an edge of the emitter electrode plate.

7. The semiconductor device of claim 3, wherein the emitter electrode plate is larger than the base electrode plate.

8. The semiconductor device of claim 3, wherein the base electrode plate comprises a protruding portion, the emitter electrode plate comprises an indented portion, and the protruding portion is located in the indented portion.

9. The semiconductor device of claim 8, wherein the protruding portion takes a form of a strip, the indented portion takes a form of a slit that does not split the emitter electrode plate completely, and the strip of the base electrode plate and the slit of the emitter electrode plate are parallel to the edge of the semiconductor chip.

10. The semiconductor device of claim 9, wherein each portion of the emitter electrode plate split by the slit is large enough to form an electrical connection to the emitter terminal.

11. The semiconductor device of claim 9, wherein each portion of the emitter electrode plate split by the slit has substantially the same area.

12. The semiconductor device of claim 8, wherein a top portion of the protruding portion is connected to the base region.

\* \* \* \* \*